United States Patent [19]

Hiraiwa et al.

[11] Patent Number: 5,679,125
[45] Date of Patent: Oct. 21, 1997

[54] METHOD FOR PRODUCING SILICA GLASS FOR USE WITH LIGHT IN A VACUUM ULTRAVIOLET WAVELENGTH RANGE

[75] Inventors: Hiroyuki Hiraiwa, Yokohama; Seishi Fujiwara; Norio Komine, both of Sagamihara, all of Japan

[73] Assignee: Nikon Corporation, Japan

[21] Appl. No.: 498,157

[22] Filed: Jul. 5, 1995

[30] Foreign Application Priority Data

Jul. 7, 1994 [JP] Japan .................................. 6-156302

[51] Int. Cl.$^6$ .................. C03B 37/075; C03C 13/00; G02B 6/00
[52] U.S. Cl. .................................................. 65/397
[58] Field of Search .................................. 65/17.3, 17.4, 65/17.5, 397, 399, 413, 424, 900

[56] References Cited

U.S. PATENT DOCUMENTS

| | | | |
|---|---|---|---|
| 4,162,908 | 7/1979 | Rau et al. | 65/60 |
| 5,086,352 | 2/1992 | Yamagata et al. | 359/350 |
| 5,325,230 | 6/1994 | Yamagat et al. | 359/350 |
| 5,326,729 | 7/1994 | Yaba et al. | 501/54 |
| 5,364,433 | 11/1994 | Nishimura et al. | 65/17.4 |
| 5,410,428 | 4/1995 | Yamagata et al. | 359/350 |
| 5,474,589 | 12/1995 | Ohga et al. | 65/397 |
| 5,523,266 | 6/1996 | Nishimura et al. | 501/54 |

FOREIGN PATENT DOCUMENTS

| | | |
|---|---|---|
| A 0 483 752 | 5/1992 | European Pat. Off. |
| 0 483 320 | 6/1992 | European Pat. Off. |
| A 0 488 320 | 6/1992 | European Pat. Off. |
| A 0 546 196 | 6/1993 | European Pat. Off. |

OTHER PUBLICATIONS

Patent Abstracts of Japan, vol. 18, No. 288, Jun. 2, 1994 and JP 6056457, Mar. 1, 1994.

Shamoto et al., "Radiation–resistance characteristics of fluorine–doped silica fiber", Abstract from Database Inspec, Institute of Electrical Engineers, Stevenage, GB Inspec. No. 4846363.

Khotimchenko et al., "Determining the Content of Hydrogen Dissolved in Quartz Glass Using the Methods of Raman Scattering and Mass Spectrometry", translated from Zhurnal Prikladnoi Spectroskopii, vol. 46, No. 6, pp. 987–991, Jun. 1987.

*Primary Examiner*—Donald E. Czaja
*Assistant Examiner*—Jacqueline A. Ruller
*Attorney, Agent, or Firm*—Pennie & Edmonds LLP

[57] ABSTRACT

A method for producing a synthetic silica glass for use with vacuum ultraviolet light comprises the steps of: (a) producing a soot preform; (b) heating the soot preform in an atmosphere containing fluorine to obtain a fluorine-doped soot preform; (c) consolidating the fluorine-doped soot preform to obtain a fluorine-doped synthetic silica glass; and (d) heating the fluorine-doped synthetic silica glass in an atmosphere containing hydrogen gas to obtain a synthetic silica glass doped with fluorine and hydrogen molecules. A synthetic silica glass having both a high transmittance and high ultraviolet light resistance with respect to light in the vacuum ultraviolet wavelength range can be produced.

9 Claims, 5 Drawing Sheets

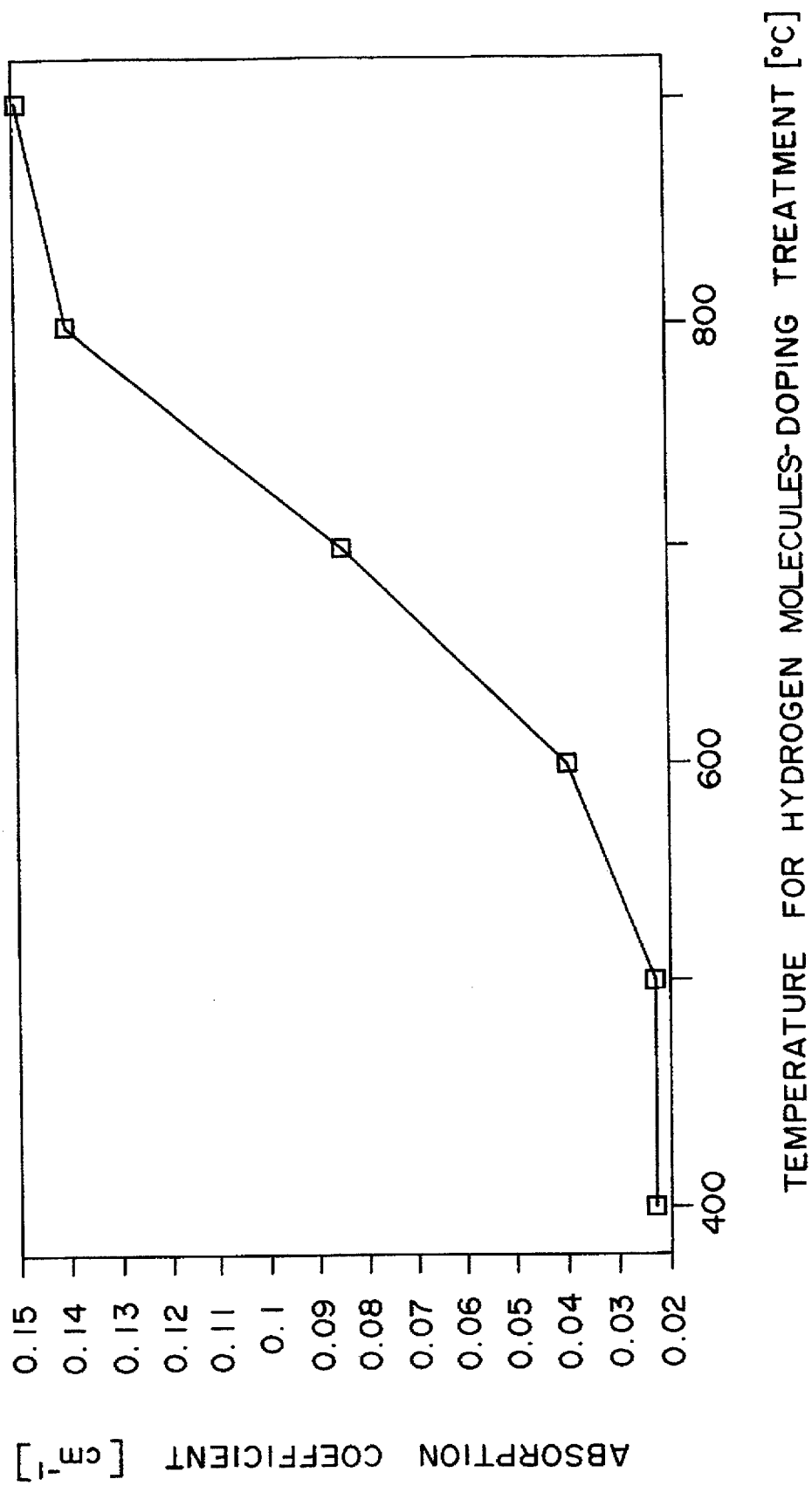

METHOD FOR PRODUCING SILICA GLASS FOR USE WITH LIGHT IN A VACUUM ULTRAVIOLET WAVELENGTH RANGE

BACKGROUND OF THE INVENTION

1. Field of the Invention

The present invention relates to a method for producing a silica glass used for an optical system using light in an ultraviolet wavelength range, typically photolithography. More specifically, the present invention relates to a method for producing a silica glass used for an optical system using light in a vacuum ultraviolet wavelength range of 200 nm or less, especially for ArF excimer laser (193 nm) lithography, $F_2$ laser (157 nm) lithography, and the like. Further, the present invention relates to a synthetic silica glass produced by the method and an optical member comprising the synthetic silica glass.

2. Related Background Art

Conventionally, an exposure apparatus called a stepper has been used in a photolithographic technique of exposing/transferring a fine pattern of an integrated circuit onto a wafer such as a silicon wafer. With the recent increase in the integration degree of LSIs, the wavelength of a light source for this stepper has been shortened from a g-line (436 nm) to an i-line (365 nm), a KrF excimer laser beam (248 nm), and an ArF excimer laser beam (193 nm). In general, as an optical material used for a lens of an illumination optical system or a projection optical system of a stepper, a material having ultraviolet light resistance and a high transmittance with respect to light in a wavelength range shorter than that of an i-line is required. For this reason, synthetic silica glass is used.

However, in a case where light in a vacuum ultraviolet wavelength range is used, there is an absorption due to various factors in even silica glass. In a high-precision optical system such as a stepper or an optical system using an $F_2$ laser with a shorter wavelength (157 nm), even slight absorption causes generation of heat or fluorescence, resulting in a deterioration in optical performance.

Silica glass for use with light in such an ultraviolet wavelength range, and a method for producing the silica glass have been disclosed in, e.g., U.S. Pat. No. 5,086,352 and European Patent Application Publication No. (EP-A1) 0 488 320.

SUMMARY OF THE INVENTION

The present inventors have found that the following problems have been posed in such a conventional silica glass, and satisfactory characteristics have not been attained with regard to transmittance and ultraviolet light resistance with respect to vacuum ultraviolet light.

In a photolithographic technique using light in the vacuum ultraviolet wavelength range, since light in the vacuum ultraviolet wavelength range is higher in energy than an i-line or a KrF excimer laser beam, a very large load is imposed on a lens material and the like. For this reason, a lens, an optical system and the like which use the conventional synthetic silica glass have short service lives, and such an optical system undergoes a considerable deterioration in performance.

Further, a conventional synthetic silica glass obtained by a so-called VAD method often has structural defects. For example, an oxygen deficient-type defect (Si—Si bond) itself has an absorption band of 163 nm. In addition, upon irradiation of an ultraviolet light having high energy such as an excimer laser beam, an absorption band based on a structural defect called an E' center (Si) is formed at a wavelength of 215 nm.

It is an object of the present invention to provide a synthetic silica glass having both a high transmittance and high ultraviolet light resistance with respect to light in the vacuum ultraviolet wavelength range, which glass can be suitably used for a high-precision optical system for photolithography using light in the vacuum ultraviolet wavelength range.

The present inventors made attempts to dope hydrogen molecules in glass to improve the ultraviolet light resistance and also dope fluorine in the glass to eliminate absorption caused by a structural defect (to ensure a high initial transmittance) and improve the ultraviolet light resistance.

Upon repeating experiments on hydrogen- and fluorine-doping, the inventors have found that a synthetic silica glass is allowed to contain hydrogen in the form of molecules together with fluorine by means of doping fluorine in a so-called soot preform, consolidating the preform, and then doping hydrogen molecules therein, and that a silica glass superior in ultraviolet light resistance to a silica glass doped with hydrogen molecules in the absence of fluorine can be obtained.

The present invention provides a method for producing a synthetic silica glass for use with light in a vacuum ultraviolet wavelength range, comprising the steps of:

(a) hydrolyzing a silicon compound in a flame to obtain fine glass particles, and depositing the fine glass particles to form a porous glass mass;

(b) heating the porous glass mass in an atmosphere containing fluorine to obtain a fluorine-doped porous glass mass;

(c) consolidating the fluorine-doped porous glass mass to obtain a fluorine-doped synthetic silica glass; and (d) heating the fluorine-doped synthetic silica glass in an atmosphere containing hydrogen gas to obtain a synthetic silica glass doped with fluorine and hydrogen (hydrogen molecules).

Further, the present invention provides a fluorine- and hydrogen molecules-doped synthetic silica glass for use with light in a vacuum ultraviolet wavelength range, which is produced by the above method of the present invention.

Furthermore, the present invention provides an optical member for use with light in a vacuum ultraviolet wavelength range, which comprises a fluorine- and hydrogen molecules-doped synthetic silica glass produced by the above method of the present invention.

Moreover, the present invention provides an exposure apparatus for use with light in a vacuum ultraviolet wavelength range as exposure light, which comprises:

a stage allowing a photosensitive substrate to be held on a main surface thereof;

an illumination optical system for emitting the exposure light of a predetermined wavelength and transferring a predetermined pattern of a mask onto said substrate;

a projection optical system provided between a surface on which the mask is disposed and said substrate, for projecting an image of the pattern of said mask onto said substrate; and an optical member comprising a fluorine- and hydrogen molecules-doped synthetic silica glass which is produced by the above-mentioned method of the present invention.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 5 is a graph showing the relationship between the temperature for hydrogen molecules-doping treatment and a change in absorption coefficient which is caused by irradiation of an $F_2$ laser beam.

DETAILED DESCRIPTION OF THE PREFERRED EMBODIMENTS

Figure 1:
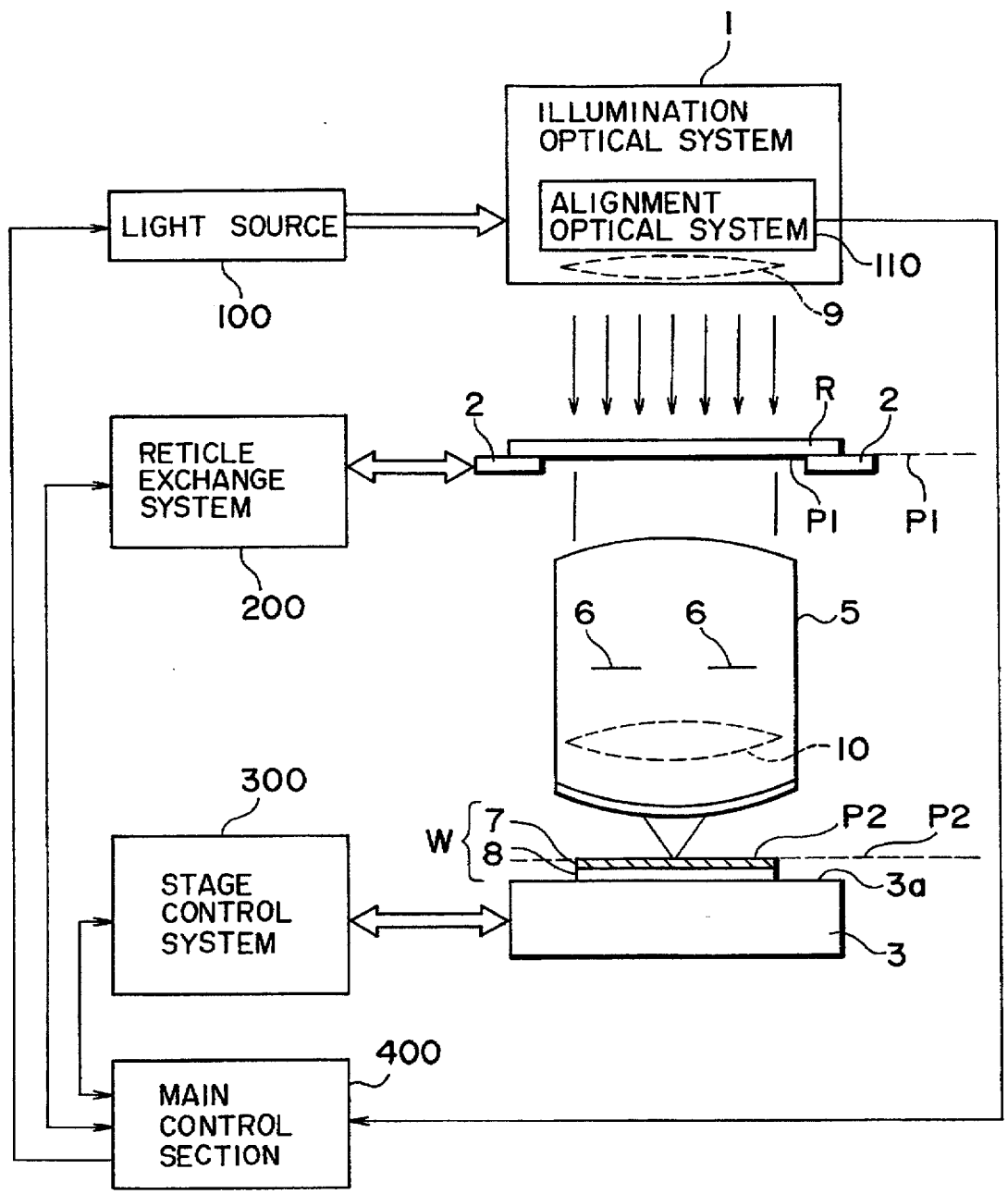
FIG. 1 is a block diagram showing the basic structure of an example of the exposure apparatus of the present invention.

The method for producing a synthetic silica glass for use with light in a vacuum ultraviolet wavelength range according to the present invention will be described first.

In the method of the present invention, (a) fine glass particles (so-called soot) are obtained by causing hydrolytic reaction of a silicon compound such as $SiCl_4$ in an oxygen-hydrogen flame, and the fine glass particles are deposited to form a porous glass mass (a so-called soot preform). The method for forming such a porous glass mass is not specifically defined, and so are the conditions for the formation. A so-called VAD (Vapor phase Axial Deposition) method, a so-called OVD (Outside Vapor Deposition) method, or the like is properly used.

In the present invention, (b) the porous glass mass is heated in an atmosphere containing fluorine to obtain a fluorine-doped porous glass mass. As this atmosphere containing fluorine, an inert gas atmosphere containing 0.1 to 100 vol % of a fluorine compound gas such as $SiF_4$ is preferable. In addition, the pressure set in this fluorine-doping treatment is preferably 0.1 to 10 atm; and the temperature set in this fluorine-doping treatment is preferably 1,000° to 1,700° C. It tends to be difficult to dope a sufficient amount of fluorine outside the above range of conditions.

In the present invention, (c) the fluorine-doped porous glass mass is consolidated to obtain a fluorine-doped synthetic silica glass. In general, a porous glass mass is consolidated in an inert gas atmosphere such as an He atmosphere at a temperature near the softening point (preferably the melting point) of the glass or higher. In the method of the present invention, the porous glass mass is preferably consolidated in an atmosphere containing fluorine. This is because consolidation in an atmosphere containing fluorine tends to increase and maintain the amount of fluorine doped in the glass. As this atmosphere containing fluorine, an inert gas atmosphere containing 0.1 to 100 vol % of a fluorine compound gas such as $SiF_4$ is preferable. In addition, the pressure set in this consolidation process is preferably 0.1 to 10 atm. Note that, in a case where the porous glass mass is consolidated in an atmosphere containing fluorine, the fluorine-doping step {step (b)} and the consolidation step {step (c)} can be performed as a single step.

In the method of the present invention, (d) the fluorine-doped synthetic silica glass is heated in an atmosphere containing hydrogen gas to obtain a synthetic silica glass doped with fluorine and hydrogen molecules. As this atmosphere containing hydrogen gas, an inert gas atmosphere containing 0.1 to 100 vol % of hydrogen gas is preferable. In addition, the pressure set in this hydrogen molecules-doping treatment is preferably 0.1 to 10 atm. It tends to be difficult to dope a sufficient amount of hydrogen molecules outside the above range of conditions.

The temperature set during the above hydrogen molecules-doping treatment {step (d)} is preferably not more than 500° C., more preferably 0° to 500° C., and most preferably 300° to 500° C. The reason why this temperature range is preferable will be described later.

In the method of the present invention, since the above porous glass mass (soot preform) is doped with fluorine, an incomplete structure (bond) in the porous glass mass can be terminated by fluorine. In performing a dehydration or consolidation process for a porous glass mass synthesized by the VAD method, in particular, the atmosphere tends to become an oxygen deficient atmosphere, and an Si—Si bond having an absorption band at a wavelength of 163 nm tends to be formed. According to the present invention, under the presence of F, the Si—Si bond is cut, and the structure can be terminated by an Si—F bond, thereby canceling the formation of the above absorption band. In addition, an Si—F bond is higher in bond energy (binding energy) than an Si—H or Si—Cl bond and can stably maintain its structure even if it receives the strong energy of ultraviolet light.

In the method of the present invention, after the porous glass mass is consolidated, the glass is heated in a hydrogen gas atmosphere within a temperature range of preferably not more than 500° C. Doping of hydrogen molecules can be performed within the temperature range from room temperature to 2,500 K (2,227° C.) from the thermodynamic viewpoint. When hydrogen molecules-doping is performed at a relatively low temperature, and preferably 500° C. or lower, hydrogen molecules-doping can be performed in a state of hydrogen molecules without forming an Si—H bond which tends to be cut and become an E' center upon irradiation of light in an ultraviolet wavelength range, and without reducing the number of Si—F bonds. Therefore, the E' center formed upon irradiation of the ultraviolet light is terminated by doped hydrogen molecules to obtain better ultraviolet light resistance, in addition to the above strong structure. When such a heat treatment in a hydrogen atmosphere is performed at a temperature of more than 500° C., Si—H bonds tend to be formed, and thus the ultraviolet light resistance tends to deteriorate. For this reason, it is not preferable that the above heat treatment temperature be further increased.

In the method of the present invention, between the steps (a) and (b) described above, (f) the porous glass mass is preferably heated in an atmosphere containing chlorine, more preferably in an inert gas atmosphere containing chlorine gas and/or a chlorine compound. This process is a so-called dehydration process of removing moisture from the porous glass mass obtained by the hydrolytic method before the consolidation process. With this dehydration process, the OH group concentration in the synthetic silica glass after the consolidation process can be decreased to 100 ppb or less.

If the porous glass mass is consolidated without sufficiently performing such a dehydration process, the resultant synthetic silica glass tends to have a weak structure. This may be because that weak bonds and unstable structures are present in the glass. If many OH groups are present in the porous glass mass, HF tends to be formed in the subsequent fluorine-doping treatment. In addition, with the above dehydration process, metal impurities can be removed as chlorides from the glass. In the method of the present invention, therefore, as described above, the dehydration process for a porous glass mass is preferably performed before the fluorine-doping treatment.

Furthermore, in the method of the present invention, between the steps (c) and (d) described above, (e) the fluorine-doped synthetic silica glass may be heated in an inert gas atmosphere having a partial oxygen pressure of $10^0$ to $10^{-10}$ atm at a temperature of 700° C. or more.

When the fluorine-doped silica glass is heated under a partial oxygen pressure of $10^0$ to $10^{-10}$ atm, a synthetic silica glass having an OH group concentration of about 200 to 300 ppb or more can be obtained. Although the heat treatment under a partial oxygen pressure is performed to eliminate the distortion of the glass, the main purpose of this treatment is to form a small amount of OH groups in the fluorine-doped silica glass. Although the formation process of OH groups in this treatment is not clarified well, it is assumed that Si—OH bonds are formed upon reaction between a small amount of $H_2O$ left in the glass structure and a small amount of Si—Si bonds which do not appear in absorption.

A synthetic silica glass for use with light in a vacuum ultraviolet wavelength range according to the present invention will be described next.

The synthetic silica glass of the present invention is obtained by the method of the present invention described above. This synthetic silica glass is doped with both fluorine and hydrogen (hydrogen molecules). The ultraviolet light resistance of the synthetic silica glass of the present invention is greatly improved by the synergistic effect of the ultraviolet light resistance characteristics of the fluorine and hydrogen molecules doped in the glass. The fluorine concentration in the synthetic silica glass of the present invention is preferably 100 ppm or more, more preferably 100 to 30,000 ppm, and most preferably 500 to 30,000 ppm. The hydrogen molecule concentration in the synthetic silica glass of the present invention is preferably $1 \times 10^{17}$ molecules/cm$^3$ or more, and more preferably $1 \times 10^{17}$ to $1 \times 10^{19}$ molecules/cm$^3$. Desired characteristics tend to be difficult to obtain outside the above ranges of the contents of the respective elements.

In addition, the OH group concentration in the synthetic silica glass of the present invention is preferably 100 ppm or less, and more preferably 10 ppb to 100 ppm.

With an OH group concentration of 100 ppm or less, a high transmittance and a high ultraviolet light resistance in a vacuum ultraviolet wavelength range tend to be ensured. More specifically, as the concentration of OH groups contained in the silica glass increases, structural defects unique to the silica glass, which are left even after F-doping, are terminated by the OH groups, and hence a higher transmittance and better ultraviolet light resistance can be obtained with respect to light in the ultraviolet wavelength range. If, however, the silica glass contains more than 100 ppm of OH groups, the absorption edge in the vacuum ultraviolet wavelength range of the resultant silica glass shifts toward the long-wavelength side, and thus it becomes difficult to use the resultant silica glass in a high-precision optical system.

In addition, such OH groups serve to stabilize a glass structure. When a laser beam is irradiated on the glass, the OH groups suppress formation of an absorption band and improve the ultraviolet light resistance (laser resistance). Furthermore, under the presence of such OH groups, initial absorption in the resultant silica glass is suppressed. For this reason, a silica glass for use with light in an ultraviolet wavelength range such as a KrF or ArF laser beam may have an OH group concentration of 10 ppb to 1,000 ppm, and preferably 10 ppb to 100 ppm.

In contrast to this, since an OH group absorption band is present near a wavelength of 150 nm, a silica glass for used with light in a vacuum ultraviolet wavelength range such as an $F_2$ laser beam tends to decrease in initial transmittance with an increase in OH group concentration. In particular, in this case, therefore, the OH group concentration is preferably 10 ppb to 20 ppm.

In the synthetic silica glass of the present invention, metal impurities such as alkali metals, alkali earth metals, and transition metals are the cause of a structural defect having an absorption band in the ultraviolet wavelength range. More specifically, since bonds of the metal impurities are easily cut by irradiation of high-energy light such as ultraviolet light or vacuum ultraviolet light, the ultraviolet light resistance is greatly degraded. For this reason, such metal impurities contained in the glass are preferably minimized (preferably to 50 ppb or less).

An optical member for use with vacuum ultraviolet light according to the present invention will be described next.

The optical member of the present invention comprises the fluorine- and hydrogen molecules-doped synthetic silica glass obtained by the method of the present invention. The optical member of the present invention is not specifically defined except that the member comprises the above-mentioned synthetic silica glass. That is, the optical member includes various optical members for use with light in a vacuum ultraviolet wavelength range, e.g., a lens, a prism and the like used in an exposure apparatus such as a stepper. Further, the optical member of the present invention also includes blanks. In addition, a method for processing the synthetic silica glass of the present invention into the optical member of the present invention is not specifically defined, and a general cutting method, a general polishing method, and the like are employed.

The optical member of the present invention contains the above-mentioned synthetic silica glass of the present invention which has both a high ultraviolet light resistance and a high transmittance with respect to vacuum ultraviolet light owing to the synergistic effect of the fluorine and hydrogen (hydrogen molecules) doped in the glass. For this reason, the optical member of the present invention achieves a longer service life than the conventional optical members.

An exposure apparatus of the present invention will be described next.

The present invention is preferably applied to the projection exposure apparatus, such as a so-called stepper, for projecting an image of patterns of reticle onto a wafer coated with a photoresist.

FIG. 1 shows a basic structure of the exposure apparatus according to the present invention. As shown in FIG. 1, an exposure apparatus of the present invention comprises at least a wafer stage 3 allowing a photosensitive substrate W to be held on a main surface 3a thereof, an illumination optical system 1 for emitting vacuum ultraviolet light of a predetermined wavelength as exposure light and transferring a predetermined pattern of a mask (reticle R) onto the substrate W, a light source 100 for supplying the exposure light to the illumination optical system 1, a projection optical system (preferably a catadioptric one) 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. A reticle exchange system 200 conveys and changes a reticle (mask R) to be set on the reticle stage 2. The reticle exchange system 200 includes a stage driver for moving the reticle stage 2 in parallel with respect to the main surface 3a of the wafer stage 3. The projection optical system 5 has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 300. Further, since a main control section 400 such as a computer system controls the light source 100, the reticle exchange system 200, the stage control system 300 or the like, the exposure apparatus can perform a harmonious action as a whole.

The exposure apparatus of the present invention comprises an optical member which comprises a fluorine- and hydrogen molecules-doped synthetic silica glass produced by the method of the present invention, for example an optical lens consisting of the above-mentioned synthetic silica glass. More specifically, the exposure apparatus of the present invention shown in FIG. 1 can include the optical lens of the present invention as an optical lens 9 in the illumination optical system 1 and/or an optical lens 10 in the projection optical system 5.

The exposure apparatus of the present invention includes the above-mentioned optical member comprising the synthetic silica glass of the present invention which has both a high ultraviolet light resistance and a high transmittance with respect to light in a vacuum ultraviolet wavelength range owing to the synergistic effect of the fluorine and hydrogen (hydrogen molecules) doped in the glass. For this reason, the exposure apparatus of the present invention achieves a longer service life than the conventional exposure apparatuses.

The techniques relating to an exposure apparatus of the present invention are described, for example, in U.S. patent application Ser. No. 255,927, No. 260,398, No. 299,305, U.S. Pat. No. 4,497,015, No. 4,666,273, No. 5,194,893, No. 5,253,110, No. 5,333,035, No. 5,365,051, No. 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and repeat type exposure apparatus capable of using the catadioptric projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus. These documents are hereby incorporated by reference.

As explained above, according to the method of the present invention, it becomes possible to produce a synthetic silica glass having both a high transmittance and high ultraviolet light resistance with respect to light in the vacuum ultraviolet wavelength range. Therefore, according to the present invention, it becomes possible to obtain an optical member which has both a high transmittance and high ultraviolet light resistance with respect to light in the vacuum ultraviolet wavelength range, and thus which has a long service life.

Further, according to the present invention, a silica glass which had a high ultraviolet light resistance and no fluorescence band of 650 nm near an He—Ne laser wavelength (633 nm) used for wafer alignment can be obtained, with the good vacuum ultraviolet transmittance characteristics of a fluorine-doped silica glass being maintained.

By use of the above-mentioned silica glass or optical member of the present invention, an improvement in performance and an increase in service life of a photolithographic apparatus, such as an exposure apparatus, which uses light in a vacuum ultraviolet wavelength range such as an $F_2$ laser beam can be achieved.

Further, in comparison with the conventional synthetic silica glass containing hydrogen molecules which contains a large amount of OH groups (at least 100 ppm) as the essential condition, the silica glass of the present invention is superior in ultraviolet light resistance.

In addition, although such a large amount of OH groups decrease the initial transmittance in the vacuum ultraviolet wavelength range (near the absorption end), according to the present invention, a silica glass having a high transmittance in the vacuum ultraviolet wavelength range can be obtained, since such OH groups are not indispensable and fluorine is doped in the silica glass of the present invention.

EXAMPLES 1 AND 2 AND COMPARATIVE
EXAMPLES 1–4

(Example 1)

Figure 2:
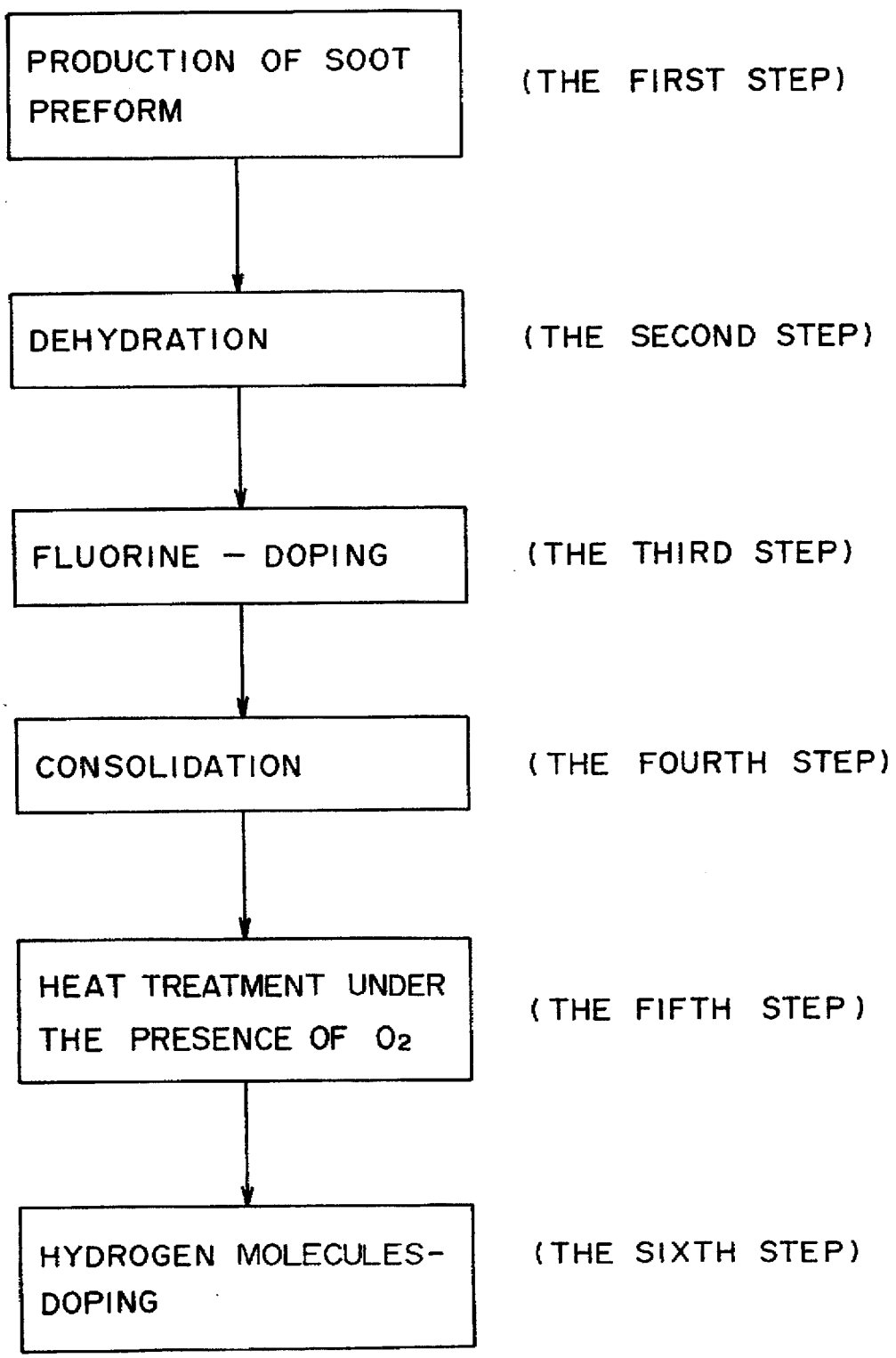
FIG. 2 is a flow chart showing an example of the method of the present invention for producing a synthetic silica glass of the present invention.

A synthetic silica glass sample of the present invention was produced in accordance with a series of steps (sequence) shown in FIG. 2. In this example, heat treatment (the fifth step) under the presence of oxygen was not performed.

More specifically, first of all, $SiCl_4$ was hydrolyzed in an oxygen-hydrogen flame by using a ring burner having a quintuple-tube structure under the following conditions to obtain fine glass particles (SiO$_2$ soot), and the fine glass particles were deposited to synthesize a porous glass mass (soot preform) having a diameter of 180 mm and a length of 500 mm in 20 hours (the first step).

| [Gas composition] (①: inner ring to ⑤: outer ring) | | |
|---|---|---|
| ① silicon tetrachloride | 10 g/min + He carrier | 1 slm |
| ② oxygen | | 5 slm |
| ③ hydrogen | | 10 slm |
| ④ oxygen | | 15 slm |
| ⑤ hydrogen | | 40 slm |

The above porous glass mass was dehydrated (the second step) under the conditions shown in Table 1. The porous glass mass was then doped with fluorine in an SiF$_4$ atmosphere (the third step), and consolidated (the fourth step), under the conditions shown in Table 1. The resultant silica glass member was cut and polished to produce a sample having a diameter of 60 mm and a thickness of 10 mm. When the fluorine concentration in the sample was measured by colorimetry, the concentration was 1 wt %. This sample was then treated by heat in a hydrogen gas atmosphere at 400° C. for 60 hours under the conditions shown in Table 1 (the sixth step). As a result, the fluorine concentration in the sample underwent no change, and the hydrogen molecule concentration in the sample was 5×10$^{17}$ molecules/cm$^3$. The OH group concentration was about 75 ppb.

The hydrogen molecule concentration was calculated as a contained-hydrogen concentration C (H$_2$ molecules/cm$^3$ glass) according to the following equation by obtaining the ratio of scattering intensities I of 4,135 cm$^{-1}$ and 800 cm$^{-1}$ using the argon ion laser Raman scattering measuring device disclosed in Zhurnal Prikladoni Spektroskopii, Vol. 46, No. 6, pp. 987–991, June, 1987:

$$C=[I(4,135\ cm^{-1})]/[I(800\ cm^{-1})]\times k$$

where k is a constant, and k=1.22×10$^{21}$.

The OH group concentration was obtained by measuring absorption of 2.73 μm with an infrared spectrophotometer. According to this measuring method in which the sample has a thickness of 10 mm, it is possible to make sure of the presence of OH group of 10 ppb or more, and it is possible to determine accurately the OH group concentration of 100 ppb or more.

(Comparative Example 1)

Following the same procedures as in Example 1, SiCl$_4$ was hydrolyzed in an oxygen-hydrogen flame, and SiO$_2$ soots were deposited to obtain a porous glass mass (the first step). The porous glass mass was then treated by heat in a hydrogen gas atmosphere under the conditions shown in Table 1 (the second step). Thereafter, the porous glass mass was doped with fluorine in an SiF$_4$ atmosphere (the third step), and then consolidated (the fourth step), under the conditions shown Table 1. The resultant silica glass member was cut and polished to produce a sample having a diameter of 60 mm and thickness of 10 mm. The fluorine concentration and hydrogen molecule concentration in the sample were measured. The fluorine concentration was 500 ppm, and the hydrogen molecule concentration was below the detection limit (1×10$^{16}$ molecules/cm$^3$). The OH group concentration was about 75 ppb.

(Example 2)

Following the same procedures as in Example 1, SiCl$_4$ was hydrolyzed in an oxygen-hydrogen flame, and SiO$_2$ soots were deposited to obtain a porous glass mass (the first step). The porous glass mass was then dehydrated (the second step), doped with fluorine in an SiF$_4$ atmosphere (the third step), and then consolidated (the fourth step), under the conditions shown in Table 1. The resultant silica glass member was cut and polished to produce a sample having a diameter of 60 mm and a thickness of 10 mm. The measured fluorine concentration in the sample was 1 wt %. This sample was treated by heat in an Ar gas atmosphere having a partial oxygen pressure of 10$^{-4}$ atm at 1,050° C. for 60 hours (the fifth step), and, thereafter, the sample was further treated by heat in a hydrogen gas atmosphere at 400° C. for 60 hours (the sixth step), under the conditions shown in Table 1. As a result, the fluorine concentration in the sample underwent no change before and after the treatment, and the hydrogen molecule concentration in the sample was 7×10$^{17}$ molecules/cm$^3$. The OH group concentration, which was about 75 ppb before the treatment of the fifth step, increased to 1 ppm after the treatment of the fifth and sixth steps.

(Comparative Example 2)

A synthetic silica glass sample was obtained following the same procedures as in Example 1 except that an atmosphere containing no SiF$_4$ was used in the third and fourth steps, and the sixth step was not performed.

The fluorine concentration in the resultant sample was below the detection limit (1 ppm), and the hydrogen molecule concentration was also below the detection limit (1×10$^{16}$ molecules/cm$^3$). The OH group concentration was about 75 ppb.

(Comparative Example 3)

A synthetic silica glass sample was obtained following the same procedures as in Example 1 except that the sixth step was not performed.

The fluorine concentration in the resultant sample was 1 wt %, and the hydrogen molecule concentration was below the detection limit (1×10$^{16}$ molecules/cm$^3$). The OH group concentration was about 75 ppb.

(Comparative Example 4)

A synthetic silica glass sample was obtained following the same procedures as in Example 1 except that an atmosphere containing no SiF$_4$ was used in the third and fourth steps.

The fluorine concentration in the resultant sample was below the detection limit (1 ppm), and the hydrogen molecule concentration was 5×10$^{17}$ molecules/cm$^3$. The OH group concentration was about 75 ppb.

TABLE 1

| STEP | Example Comp. Ex. | Composition of surrounding gas (flow rate [slm]) | | Temperature [°C.] | Pressure [atm] | Period of time [hours] |
|---|---|---|---|---|---|---|
| The second step | Example. 1 | $Cl_2$ (1.0) + | He (20.0) | 1100 | 1.0 | 20 |
| | Example. 2 | $Cl_2$ (1.0) + | He (20.0) | 1100 | 1.0 | 20 |
| | Comp. Ex. 1 | $H_2$ (5.0) | — — | 1100 | 1.0 | 20 |
| | Comp. Ex. 2 | $Cl_2$ (1.0) + | He (20.0) | 1100 | 1.0 | 20 |
| | Comp. Ex. 3 | $Cl_2$ (1.0) + | He (20.0) | 1100 | 1.0 | 20 |
| | Comp. Ex. 4 | $Cl_2$ (1.0) + | He (20.0) | 1100 | 1.0 | 20 |
| The third step | Example. 1 | $SiF_4$ (0.6) + | He (20.0) | 1300 | 1.0 | 20 |
| | Example. 2 | $SiF_4$ (0.6) + | He (20.0) | 1300 | 1.0 | 20 |
| | Comp. Ex. 1 | $SiF_4$ (0.6) + | He (20.0) | 1300 | 1.0 | 20 |
| | Comp. Ex. 2 | — — | He (20.0) | 1300 | 1.0 | 20 |
| | Comp. Ex. 3 | $SiF_4$ (0.6) + | He (20.0) | 1300 | 1.0 | 20 |
| | Comp. Ex. 4 | — — | He (20.0) | 1300 | 1.0 | 20 |
| The fourth step | Example. 1 | $SiF_4$ (0.6) + | He (20.0) | 1650 | 1.0 | 15 |
| | Example. 2 | $SiF_4$ (0.6) + | He (20.0) | 1650 | 1.0 | 15 |
| | Comp. Ex. 1 | $SiF_4$ (0.6) + | He (20.0) | 1650 | 1.0 | 15 |
| | Cbmp. Ex. 2 | — — | He (20.0) | 1650 | 1.0 | 15 |
| | Comp. Ex. 3 | $SiF_4$ (0.6) + | He (20.0) | 1650 | 1.0 | 15 |
| | Comp. Ex. 4 | — — | He (20.0) | 1650 | 1.0 | 15 |
| The fifth step | Example. 1 | — — | — — | — | — | — |
| | Example. 2 | $O_2$ ($10^{-4}$ atm) + | Ar (200.0) | 1050 | 1.0 | 60 |
| | Comp. Ex. 1 | — — | — — | — | — | — |
| | Comp. Ex. 2 | — — | — — | — | — | — |
| | Comp. Ex. 3 | — — | — — | — | — | — |
| | Comp. Ex. 4 | — — | — — | — | — | — |
| The sixth step | Example. 1 | $H_2$ (2.0) | — — | 400 | 6.0 | 60 |
| | Example. 2 | $H_2$ (2.0) | — — | 400 | 6.0 | 60 |
| | Comp. Ex. 1 | — — | — — | — | — | — |
| | Comp. Ex. 2 | — — | — — | — | — | — |
| | Comp. Ex. 3 | — — | — — | — | — | — |
| | Comp. Ex. 4 | $H_2$ (2.0) | — — | 400 | 6.0 | 60 |

Figure 3:
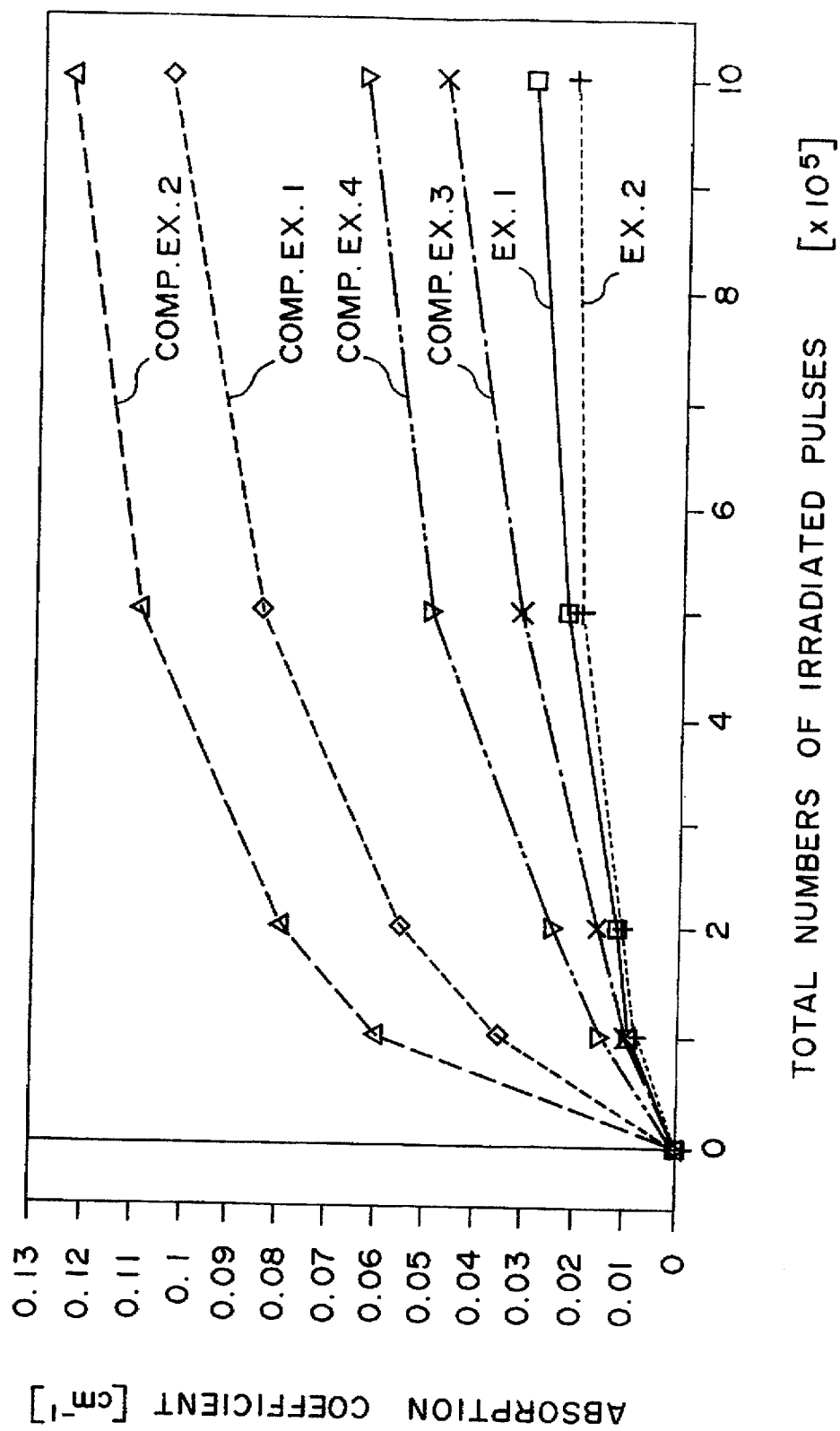
FIG. 3 is a graph showing a change in absorption coefficient at the $F_2$ laser wavelength after irradiation of an $F_2$ laser beam.

Each of the synthetic silica glass samples obtained by Examples 1 and 2 and Comparative Examples 1 to 4 was irradiated with an $F_2$ laser beam under the following conditions, and a change in absorption coefficient thereof was measured. Table 2 and FIG. 3 show the measurement result.

[Irradiation Conditions]

Figure 4:
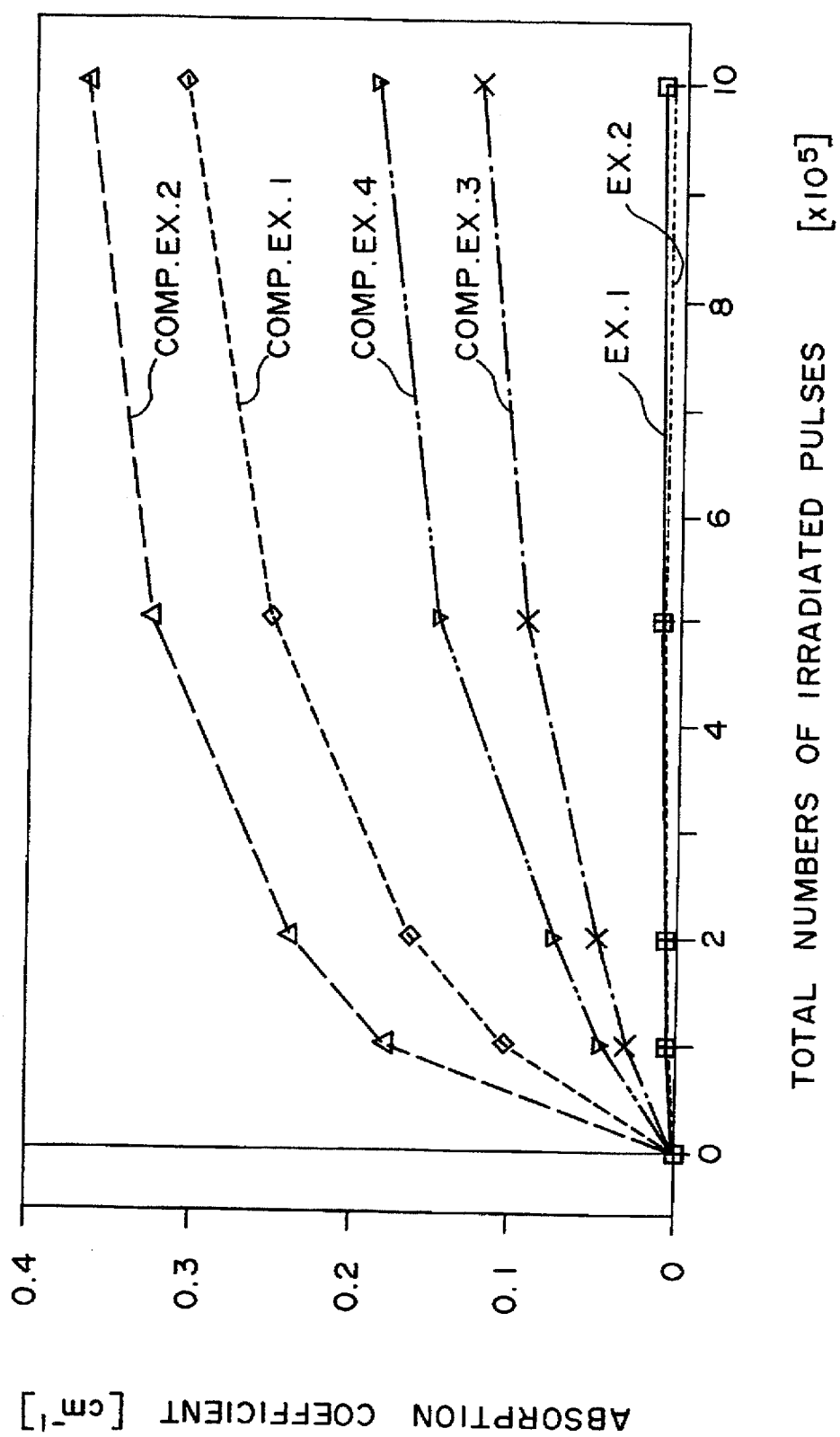
FIG. 4 is a graph showing a change in absorption coefficient at the ArF laser wavelength after irradiation of an ArF laser beam.

$F_2$ laser beam: wavelength=157 nm energy density: 25 mJ/cm$^2$ repetition frequency: 50 Hz In addition, each of the synthetic silica glass samples obtained by Examples 1 and 2 and Comparative Examples 1 to 4 was irradiated with an ArF laser beam under the following conditions, and a change in absorption coefficient thereof was measured. Table 3 and FIG. 4 show the measurement result.

[Irradiation Conditions]

ArF laser beam: wavelength=193 nm energy density: 100 mJ/cm$^2$ repetition frequency: 100 Hz

TABLE 2

| | Absorption coefficient [cm$^{-1}$] Total numbers of irradiated pulses [×10$^5$] | | | | |
|---|---|---|---|---|---|
| | 0 | 1 | 2 | 5 | 10 |
| Example 1 | 0 | 0.009 | 0.012 | 0.023 | 0.031 |
| Example 2 | 0 | 0.008 | 0.011 | 0.020 | 0.023 |
| Comp. Ex. 1 | 0 | 0.035 | 0.055 | 0.085 | 0.105 |
| Comp. Ex. 2 | 0 | 0.060 | 0.080 | 0.110 | 0.125 |

TABLE 2-continued

| | Absorption coefficient [cm$^{-1}$] Total numbers of irradiated pulses [×10$^5$] | | | | |
|---|---|---|---|---|---|
| | 0 | 1 | 2 | 5 | 10 |
| Comp. Ex. 3 | 0 | 0.010 | 0.016 | 0.032 | 0.049 |
| Comp. Ex. 4 | 0 | 0.015 | 0.025 | 0.050 | 0.065 |

TABLE 3

| | Absorption coefficient [cm$^{-1}$] Total numbers of irradiated pulses [×10$^5$] | | | | |
|---|---|---|---|---|---|
| | 0 | 1 | 2 | 5 | 10 |
| Example 1 | 0 | 0.0045 | 0.006 | 0.011 | 0.015 |
| Example 2 | 0 | 0.004 | 0.005 | 0.01 | 0.011 |
| Comp. Ex. 1 | 0 | 0.105 | 0.165 | 0.255 | 0.315 |
| Comp. EX. 2 | 0 | 0.18 | 0.24 | 0.33 | 0.375 |
| Comp. Ex. 3 | 0 | 0.03 | 0.048 | 0.096 | 0.13 |
| Comp. Ex. 4 | 0 | 0.045 | 0.075 | 0.15 | 0.195 |

As is apparent from Tables 2 and 3 and FIGS. 3 and 4, in the silica glass samples of Comparative Examples 1 to 4 which were outside the range of the present invention, structural defects were produced at the same time when laser irradiation was started, and thus considerable decreases in ultraviolet transmittance were observed. In contrast to this, the silica glass samples of Examples 1 and 2 of the present invention, which were doped with both fluorine and hydrogen molecules, exhibited a high ultraviolet light resistance.

Further, when fluorescence bands of 650 nm during irradiation of a laser beam were measured with an instantaneous multi-channel photodetector, no such bands were observed in the samples of Examples 1 and 2, while conspicuous fluorescence bands were observed in the samples of Comparative Examples 1 to 4.

Examples 3–4 and Comparative Examples 5–8

Following the same procedures as in Example 1, synthetic silica glass samples were obtained except that the treatment temperature in the hydrogen molecules-doping treatment (the sixth step) was set to 400° C. (Example 3), 500° C. (Example 4), 600° C. (Comparative Example 5), 700° C. (Comparative Example 6), 800° C. (Comparative Example 7), and 900° C.

(Comparative Example 8).

Each of the resultant samples was irradiated with an $F_2$ laser beam under the following conditions, and then an absorption coefficient thereof was measured. Table 4 and FIG. 5 show the result.

[Irradiation Conditions]

$F_2$ laser beam: wavelength=157 nm energy density: 25 mJ/cm$^2$ repetition frequency: 50 Hz total numbers of irradiated pulses: $1 \times 10^6$

TABLE 4

| | Ex. 3 | Ex.4 | Comp. Ex. 5 | Comp. Ex. 6 | Comp. Ex. 7 | Comp. Ex. 8 |
|---|---|---|---|---|---|---|
| Temperature for hydrogen molecules-doping [°C.] | 400 | 500 | 600 | 700 | 800 | 900 |
| Absorption coefficient [cm$^{-1}$] | 0.023 | 0.023 | 0.040 | 0.085 | 0.140 | 0.15 |

As is apparent from Table 4 and FIG. 5, a synthetic silica glass having a quite high ultraviolet light resistance was obtained especially when the treatment temperature in the hydrogen molecules-doping treatment (the sixth step) was 500° C. or less.

Example 5

Lenses to-be used in the projection optical system and illumination optical system of the semiconductor exposure apparatus shown in FIG. 1 were produced by using the silica glass samples obtained in Examples 1 and 2. It was confirmed that the resultant lenses were sufficiently satisfied in desired design performance. Further, the resultant lenses had a resolving power corresponding to a line width of 0.19 μm (using an ArF laser beam), and an integrated circuit pattern having practically sufficient flatness was obtained by use of the semiconductor exposure apparatus comprising the resultant lenses. Additionally, the service lives of the above lenses of the illumination optical system and the projection optical system according to the present invention were about twice as those of the conventional lenses.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 156302/1994 (6-156302) filed on Jul. 7, 1994 is hereby incorporated by reference.

What is claimed is:

1. A method for producing a synthetic silica glass for use with light in a vacuum ultraviolet wavelength range, comprising the steps of:

(a) hydrolyzing a silicon compound in a flame to obtain fine glass particles, and depositing the fine glass particles to form a porous glass mass;

(b) heating the porous glass mass in an atmosphere containing fluorine at a temperature of 1000° to 1700° C. to obtain a fluorine-doped porous glass mass;

(c) consolidating the fluorine-doped porous glass mass in an atmosphere containing fluorine at a temperature of not less than a softening point of said pourous glass mass to obtain a fluorine-doped synthetic silica glass; and (d) heating the fluorine-doped synthetic silica glass in an atmosphere containing hydrogen gas at a temperature of not more than 500° C. to obtain a synthetic silica glass doped with fluorine and hydrogen molecules.

2. A method according to claim 1, further comprising, between the step (c) and the step (d), the step of:

(e) heating said fluorine-doped synthetic silica glass in an inert gas atmosphere having a partial oxygen pressure of $10^0$ to $10^{-10}$ atm at a temperature of not less than 700° C.

3. A method according to claim 1, further comprising, between the step (a) and the step (b), the step of:

(f) said porous glass mass is heated in an atmosphere containing chlorine.

4. A method according to claim 1, wherein, in the step (b), said porous glass mass is heated in an inert gas atmosphere containing 0.1 to 100 vol % of a fluorine compound gas at a temperature of 1,000° to 1,700° C. under a pressure of 0.1 to 10 atm.

5. A method according to claim 1, wherein, in the step (c), said porous glass mass is consolidated in an inert gas atmosphere containing 0.1 to 100 vol % of a fluorine compound gas at a temperature of not less than a softening point of said pourous glass mass under a pressure of 0.1 to 10 atm.

6. A method according to claim 1, wherein the step (b) and the step (c) are performed as a single step.

7. A method according to claim 1, wherein, in the step (d), said fluorine-doped synthetic silica glass is heated in an inert gas atmosphere containing 0.1 to 100 vol % of hydrogen gas at a temperature of 0° to 500° C. under a pressure of 0.1 to 10 atm.

8. A method according to claim 1, wherein said synthetic silica glass doped with fluorine and hydrogen molecules has a fluorine concentration of not less than 100 ppm and a hydrogen molecule concentration of not less than $1 \times 10^{17}$ molecules/cm$^3$.

9. A method according to claim 1, wherein said synthetic silica glass doped with fluorine and hydrogen molecules has an absorption coefficient of not more than 0.023 cm$^{-1}$ after irradiation with $F_2$ laser beam having a wavelength of 157 nm and an energy density of 25 mJ/cm$^2$ at a repetition frequency of 50 Hz and the total number of irradiated pulses of $1 \times 10^6$.

* * * * *